United States Patent [19]

Tang et al.

[11] Patent Number: 5,317,211
[45] Date of Patent: May 31, 1994

[54] PROGRAMMABLE PIN FOR USE IN PROGRAMMABLE LOGIC DEVICES

[75] Inventors: Dandas K. Tang, Tempe; Timothy W. Sutton, Mesa, both of Ariz.

[73] Assignee: Motorola, Inc., Schaumburg, Ill.

[21] Appl. No.: 26,665

[22] Filed: Mar. 5, 1993

[51] Int. Cl.⁵ .......................................... H03K 19/173
[52] U.S. Cl. ............................. 307/465; 307/468; 364/716
[58] Field of Search ............... 307/465, 468–469; 364/716

[56] References Cited

U.S. PATENT DOCUMENTS

| | | | |
|---|---|---|---|
| 4,612,459 | 9/1986 | Pollachek | 307/465 |
| 4,721,868 | 1/1988 | Cornell | 364/716 |
| 4,835,414 | 5/1989 | Friedin | 307/465 |
| 4,992,679 | 2/1991 | Takata | 307/465 |
| 5,017,813 | 5/1991 | Galbraith | 307/465 |
| 5,027,315 | 6/1991 | Agrawal | 307/465 |
| 5,175,859 | 12/1992 | Miller | 307/465 |
| 5,237,218 | 8/1993 | Josephson | 307/465 |

*Primary Examiner*—Edward P. Westin
*Assistant Examiner*—Andrew Sanders
*Attorney, Agent, or Firm*—Bradley J. Botsch, Sr.

[57] ABSTRACT

A buffer circuit for programming an I/O pin of a programmable logic device to function either as a normal I/O site, a power pin, or a ground pin has been provided. The I/O pin may be programmed by a user by simply placing first and second control signals in appropriate logic states. The buffer circuit also includes a tri-state circuit for providing tri-state outputs when functioning as a normal I/O site.

14 Claims, 2 Drawing Sheets

PROGRAMMABLE PIN FOR USE IN PROGRAMMABLE LOGIC DEVICES

FIELD OF THE INVENTION

This invention relates to programmable logic devices and, in particular, to programming an output pin of a programmable logic device to function either as a normal I/O site, a power pin, or a ground pin.

BACKGROUND OF THE INVENTION

Existing programmable logic devices (PLD's) have a predetermined fixed number of power and ground pins wherein the other pins of the device are typically used as a normal input/output (I/O) site. However, depending upon the application, more or less power and ground pins may be required. For example, suppose a first pin is utilized as an I/O site to output a high power signal. In this case, it may be desired to have a plurality of pins (more than the fixed number) that are positioned adjacent and nearby to the first pin to be power and ground pins thereby minimizing switching noise problems especially if there exists many simultaneously switching outputs. Moreover, as the density of PLD's increases, programmable pins are quite desirable to allow optimum allocation of input/output, power and ground pins for a given application.

Hence, there exists a need to provide a circuit for allowing a user to program pins of a programmable logic device to be either an I/O site, a power pin or a ground pin.

DETAILED DESCRIPTION OF THE DRAWINGS

Figure 1:
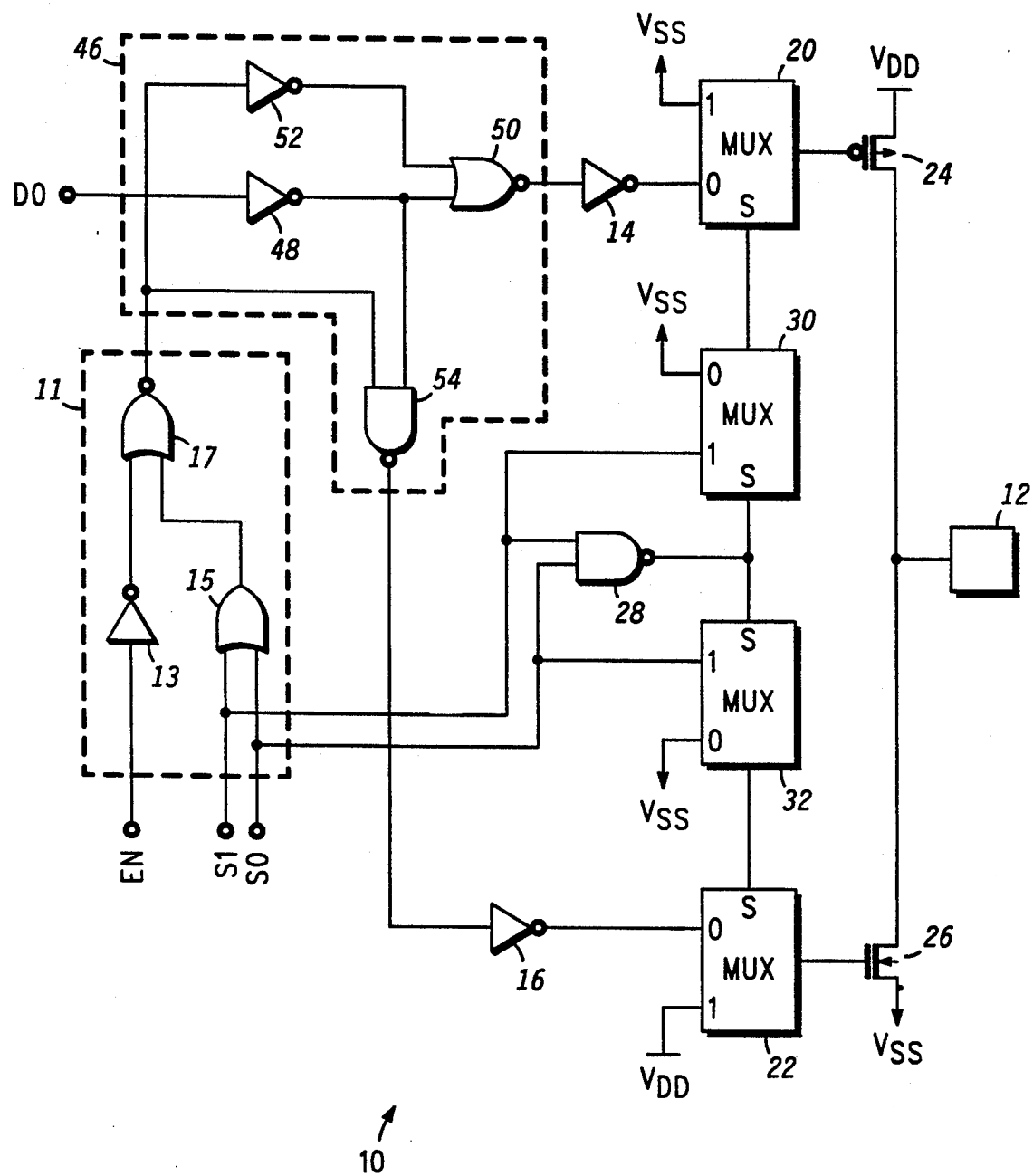
FIG. 1 is a detailed schematic/block diagram of a circuit for programming a pin to be used either as a normal input/output site, a power pin, or a ground pin.

Referring to FIG. 1, buffer circuit 10 is shown for allowing a input/output (I/O) pin/pad 12 of a programmable logic device, for example, field programmable gate arrays, to be utilized as either a normal I/O site, or an auxiliary power or ground pin.

Circuit 10 includes logic circuit 11 which has inputs responsive to enable signal EN and control signals S0 and S1. An output of logic circuit 11 is coupled to a first input of tri-state logic circuit 46. A second input of tri-state logic circuit 46 is coupled to receive driving signal D. First and second outputs of tri-state logic circuit 46 are respectively coupled to inputs of pre-drivers 14 and 16.

The outputs of pre-drivers 14 and 16 are respectively coupled to first inputs of multiplexors 20 and 22. The second input of multiplexor 22 is coupled to a first supply voltage terminal at which the operating potential $V_{DD}$ is applied, while the second input of multiplexor 20 is coupled to a second supply voltage terminal at which the operating potential $V_{SS}$ is applied, for example, ground reference.

The outputs of multiplexors 20 and 22 are respectively coupled to the gate electrodes of p-channel transistor 24 and n-channel transistor 26. The source electrode of p-channel transistor 24 is coupled to operating potential $V_{DD}$, while the source electrode of n-channel transistor 26 is coupled to operating potential $V_{SS}$. Also, the drain electrodes of both transistors 24 and 26 are coupled to pin 12.

Circuit 10 further includes NAND gate 28 having first and second inputs respectively coupled to receive control signals S0 and S1. The output of NAND gate 28 is coupled to the select inputs of both multiplexors 30 and 32.

The first inputs of multiplexors 30 and 32 are coupled to operating potential $V_{SS}$. The second inputs of multiplexors 30 and 32 are respectively coupled to receive control signals S1 and S0. The outputs of multiplexors 30 and 32 are respectively coupled to the select inputs of multiplexors 20 and 22.

Logic circuit 11 includes inverter 13 having an input coupled to receive enable signal EN. OR gate 15 has first and second inputs for receiving control signals S0 and S1, respectively. The outputs of inverter 13 and OR gate 15 are respectively coupled to first and second inputs of NOR gate 17. The output of NOR gate 17 is coupled to the first input of tri-state control circuit 46.

Tri-state control block 46 includes inverter 48 which has an input coupled to receive driving signal D and an output coupled to a first input of NOR gate 50. Tri-state block 46 further includes inverter 52 which has an input coupled to the output of logic circuit 11 and an output coupled to the second input of NOR gate 50. Also, tri-state block 46 includes NAND gate 54 which has a first input coupled to the output of inverter 48 and a second input coupled to the output of logic circuit 11. The outputs of NOR gate 50 and NAND gate 54 are respectively coupled to the inputs of pre-drivers 14 and 16.

In operation, I/O pin 12 may be programmed/configured via buffer circuit 10 to operate either as a normal I/O pin, a power pin or a ground pin depending upon the logic states of control signals S0 and S1. Further, it is understood that the logic state of control signals S0 and S1 may be changed by a user of an programmable logic device by, for example, changing the contents of a flip flop of a RAM address.

Referring to table 1, the configuration modes of I/O pin 12 are shown for the respective logic states of control signals S0 and S1.

TABLE 1

| Configuration modes of buffer circuit 10 of FIG. 1 | | |
|---|---|---|
| S1 | S0 | Mode |
| 0 | 0 | Normal |
| 1 | 0 | $V_{DD}$ |
| 0 | 1 | $V_{SS}$ |
| 1 | 1 | Disabled |

When control signals S0 and S1 are both in a logic low state, logic circuit 11 provides enable signal EN to the first input of tri-state control circuit 46. Moreover, assuming that enable signal EN is a logic high, tri-state control circuit 46 provides driving signal D to the inputs of pre-drivers 14 and 16.

The output of NAND gate 28 is a logic high thereby allowing multiplexors 30 and 32 to respectively pass signals S1 and S0 to the select inputs of multiplexors 20 and 22. As a result, the signal appearing at the output of pre-driver 14 (the inversion of signal D) is passed to the gate electrode of p-channel transistor 24 while the signal appearing at the output of pre-driver 16 (also the inversion of signal D) is passed to the gate electrode of n-channel transistor 26. In this mode, buffer circuit 10 operates to configure I/O pin 12 as a normal I/O pin such that if signal D is a logic high, then transistor 24 is active thereby forcing pin 12 to a voltage substantially equal to voltage $V_{DD}$. However, if signal D is a logic low, then transistor 26 is active thereby forcing pin 12 to a voltage substantially equal to voltage $V_{SS}$.

In addition, if enable signal EN is a logic low during normal mode, then tri-state logic circuit 46 provides a logic low and high respectively at its first and second outputs thereby turning off both output transistors 24 and 26 since it is desired to tri-state output pin 12. Thus, in this mode, buffer circuit 10 configures I/O pin 12 as a normal I/O site with tri-state control.

However, if control signal S1 is in a logic high state and control signal S0 is in a logic low state, logic circuit 11 provides a logic low to the first input of tri-state control circuit 46. Moreover, tri-state control circuit 46 provides a logic low and a logic high respectively to the inputs of pre-drivers 14 and 16.

The output of NAND gate 28 is a logic high thereby allowing multiplexors 30 and 32 to respectively pass signals S1 and S0 to the select inputs of multiplexors 20 and 22. Since control signal S0 is a logic low, the logic high appearing at the input of pre-driver 16 functions to turn off transistor 26 via multiplexor 22. However, since the logic state of signal S1 is a logic high, multiplexor 20 provides voltage $V_{SS}$ to the gate electrode of p-channel transistor 24. Assuming that voltage $V_{SS}$ is a sufficiently small voltage to render p-channel transistor 24 active, buffer circuit 10 functions to configure I/O pin 12 as a power pin having a voltage substantially equal to voltage $V_{DD}$.

Similarly, if control signal S0 is in a logic high state and control signal S1 is in a logic low state, logic circuit 11 still provides a logic low to the first input of tri-state control circuit 46. Moreover, tri-state control circuit 46 provides a logic low and a logic high respectively to the inputs of pre-drivers 14 and 16.

The output of NAND gate 28 is a logic high thereby allowing multiplexors 30 and 32 to respectively pass signals S1 and S0 to the select inputs of multiplexors 20 and 22. Since control signal S1 is a logic low, the logic low appearing at the input of pre-driver 14 functions to turn off transistor 24 via multiplexor 20. However, since the logic state of signal S0 is a logic high, multiplexor 22 provides voltage $V_{DD}$ to the gate electrode of n-channel transistor 26. Assuming that voltage $V_{DD}$ is a sufficiently large voltage to render n-channel transistor 26 active, buffer circuit 10 functions to configure I/O pin 12 as a power pin having a voltage substantially equal to voltage $V_{SS}$.

Finally, if the logic states of control signals S0 and S1 are both a logic high, logic circuit 11 provides a logic low to the first input of tri-state control circuit 46. Moreover, tri-state control circuit 46 provides a logic low and a logic high respectively to the inputs of pre-drivers 14 and 16.

The output of NAND gate 28 however becomes a logic low thereby allowing multiplexors 30 and 32 to respectively pass voltage $V_{SS}$ to the select inputs of multiplexors 20 and 22. This has the effect of applying a logic high to the gate electrode of transistor 24 and a logic low to the gate electrode of transistor 26 thereby turning off both transistors 24 and 26. In this mode output transistors 24 and 26 are disabled to prevent direct short from voltage $V_{DD}$ to voltage $V_{SS}$.

Figure 2:
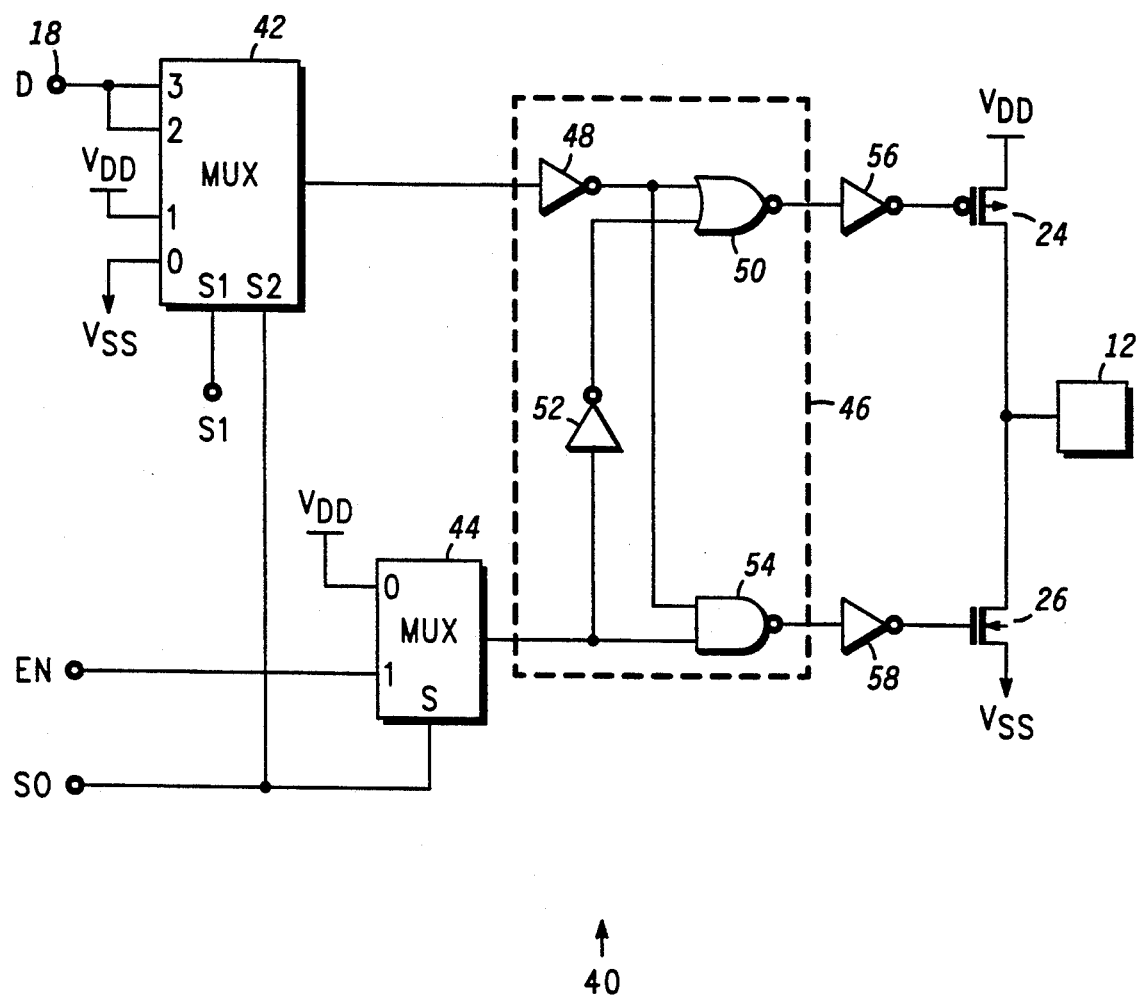
FIG. 2 is a detailed schematic/block diagram of an alternate embodiment of a circuit for programming a pin to be used either as a normal input/output site, a power pin, or a ground pin.

Referring to FIG. 2, a detailed schematic/block diagram of an alternate embodiment of a buffer circuit (40) is shown for configuring I/O pin 12 either as an I/O site, a power pin, or a ground pin. It is understood that components shown in FIG. 2 which are identical to components shown in FIG. 1 are identified by the same reference numbers. In addition, buffer circuit 40 includes multiplexor 42 having a first input coupled to receive operating potential $V_{SS}$, a second input coupled to receive operating potential $V_{DD}$ and both a third and a fourth input coupled to terminal 18 at which signal D is applied. First and second select inputs of multiplexor 42 are respectively coupled to receive control signals S0 and S1.

Multiplexor 44 has a first input coupled to receive operating potential $V_{DD}$ and a second input coupled to receive enable signal EN. The select input of multiplexor 44 is coupled to receive control signal S0.

Tri-state control block 46 has first and second inputs respectively coupled to the outputs of multiplexors 42 and 44. Also, first and second outputs of tri-state control block 46 are respectively coupled to the inputs of pre-drivers 56 and 58. Further, the outputs of pre-drivers 56 and 58 are respectively coupled to the gate electrodes of transistors 24 and 26.

In operation, I/O pin 12 may be programmed/configured via buffer circuit 40 to operate either as a normal I/O pin, a power pin or a ground pin depending upon the logic states of control signals S0 and S1. Moreover, multiplexor 44 functions as an enable select multiplexor.

Referring to table 2, the configuration modes of I/O pin 12 are shown for the respective logic states of control signals S0 and S1.

TABLE 2

| Configuration modes of I/O buffer circuit 40 of FIG. 2 | | |
|---|---|---|
| S1 | S0 | Mode |
| 0 | 0 | $V_{SS}$ |
| X | 1 | Normal |
| 1 | 0 | $V_{DD}$ |

When control signal S0 is in a logic high state and if control signal S1 is either in a logic high or a logic low state, then multiplexor 44 provides signal EN at its output while multiplexor 42 provides signal D at its output. Assuming that signal EN is a logic high, signal D appears at the first and second outputs of tri-state block 46. As a result, if signal D is a logic low, then transistor 26 is operative while transistor 24 is non-operative. But if signal D is a logic high, then transistor 24 is operative while transistor 26 is non-operative.

However, if signal EN is a logic low, then a logic low and high respectively appear at the first and second outputs of tri-state block 46. As a result, transistors 24 and 26 are both rendered non-operative. Thus, in this configuration, buffer circuit 40 functions program pin 12 as a normal I/O site with tri-state enable control.

If control signals S0 and S1 are both in a logic low state, then the output of multiplexor 42 provides voltage $V_{SS}$ and the output of multiplexor 44 provides voltage $V_{DD}$. Assuming that voltage $V_{DD}$ is indicative of a logic high state while voltage $V_{SS}$ is indicative of a logic low state, a logic low appears at the output of NOR gate 50 and a logic low appears at the output of NAND gate 54. This functions to turn off p-channel transistor 24 and turn on n-channel transistor 26 thereby coupling pin 12 to voltage $V_{SS}$. Thus, in this mode, buffer circuit 40 functions to program pin 12 as a power pin having a voltage substantially equal to voltage VSS, for example, ground reference.

However, if control signal S1 is in a logic high state and control signal S0 is in a logic low state, then multiplexor 42 functions to provide voltage $V_{DD}$ at its output while multiplexor 44 also provides voltage $V_{DD}$ at its output. Assuming that voltage $V_{DD}$ is indicative of a logic high state while voltage $V_{SS}$ is indicative of a logic low state, the output of NOR gate 50 is a logic high while the output of NAND gate 54 is also a logic high. This has the effect of turning on p-channel transistor 24 while turning off n-channel transistor 26 thereby coupling pin 12 to voltage $V_{DD}$. Thus, in this mode, buffer circuit 40 functions to program pin 12 as a power pin having a voltage substantially equal to voltage $V_{DD}$.

By now it should be apparent from the foregoing discussion that a novel buffer circuit for programming an I/O pin of a programmable logic device to function either as a normal I/O site, a power pin, or a ground pin has been provided. The I/O pin may be programmed by a user by simply placing first and second control signals in appropriate logic states. The buffer circuit also includes a tri-state circuit for providing tri-state outputs when functioning as a normal I/O site.

While the invention has been described in specific embodiments thereof, it is evident that many alterations, modifications and variations will be apparent to those of ordinary skill in the art in the light of the foregoing description. Accordingly, it is intended to embrace all such alterations, modifications and variations in the appended claims.

We claim:

1. A circuit for programming an I/O site in a programmable logic device, comprising:
   circuit means coupled to receive a driving signal, an enable signal and first and second control signals for providing first and second signals at first and second outputs;
   first multiplexor means being responsive to a first select signal for alternately providing said first signal or a first voltage at an output thereof, said first multiplexor means having an input coupled to said first output of said circuit means;
   second multiplexor means being responsive to a second select signal for alternately providing said second signal or a second voltage at an output thereof, said second multiplexor means having an input coupled to said second output of said circuit means;
   an output transistor circuit being coupled between said first and second voltages and to the I/O site, said output transistor circuit having first and second inputs being respectively coupled to said outputs of said first and second multiplexor means; and
   control means for providing said first and second select signals to said first and second multiplexor means, said control means having inputs being responsive to said first and second control signals.

2. The circuit according to claim 1 further including a pre-driver circuit coupled between said first and second outputs of said circuit means and said inputs of said first and second multiplexor means.

3. The circuit according to claim 1 wherein said control means includes:
   a third multiplexor having first and second inputs, a select input and an output, said first input of said third multiplexor being coupled to receive said second voltage, said second input of said third multiplexor being coupled to receive said second control signal, said output of said third multiplexor providing said second select signal to said second multiplexor means;
   a fourth multiplexor having first and second inputs, a select input and an output, said first input of said fourth multiplexor being coupled to receive said second voltage, said second input of said fourth multiplexor being coupled to receive said first control signal, said output of said fourth multiplexor providing said first select signal to said first multiplexor means; and
   gate means for providing a third select signal to said select inputs of said third and fourth multiplexors, said gate means having first and second inputs respectively coupled to receive said first and second control signals, said gate means having an output coupled to said select inputs of said third and fourth multiplexors.

4. The circuit according to claim 1 wherein said output transistor circuit includes:
   a p-channel transistor having first and second current carrying electrodes and a control electrode, said first current carrying electrode of said p-channel transistor being coupled to the I/O site, said second current carrying electrode of said p-channel transistor being coupled to receive said first voltage, said control electrode of said p-channel transistor being coupled to said output of said second multiplexor means; and
   an n-channel transistor having first and second current carrying electrodes and a control electrode, said first current carrying electrode of said n-channel transistor being coupled to the I/O site, said second current carrying electrode of said n-channel transistor being coupled to receive said second voltage, said control electrode of said n-channel transistor being coupled to said output of said first multiplexor means.

5. The circuit according to claim 1 wherein said circuit means includes:
   a logic circuit including:
     a first inverter having an input and an output, said input of said first inverter being coupled to receive said enable signal;
     an OR gate having first and second inputs and an output, said first and second inputs of said OR gate being respectively coupled to receive said first and second control signals; and
     a first NOR gate having first and second inputs and an output, said first and second inputs of said first NOR gate being respectively coupled to said outputs of said first inverter and said OR gate; and
   a tri-state control circuit including:
     a second inverter having an input and an output, said input of said second inverter being coupled to receive said drive signal;
     a third inverter having an input and an output, said input of said third inverter being coupled to said output of said first NOR gate;
     a second NOR gate having first and second inputs and an output, said first and second inputs of said second NOR gate being respectively coupled to said outputs of said second and third inverters, said output of said NOR gate being coupled to said first output of said circuit means; and a NAND gate having first and second inputs and an output, said first and second inputs of said NAND gate being respectively coupled to said output of said second inverter and said output of said first NOR gate, said output of said NAND gate being coupled to said second output of said circuit means.

6. A circuit for programming an I/O site in a programmable logic device, comprising:

a first multiplexor having first and second inputs, a select input and an output, said first input of said first multiplexor being coupled to receive a first signal, said second input of said first multiplexor being coupled to a first supply voltage terminal;

a second multiplexor having first and second inputs, a select input and an output, said first input of said second multiplexor being coupled to receive a second signal, said second input of said second multiplexor being coupled to a second supply voltage terminal;

a p-channel transistor having first and second current carrying electrodes and a control electrode, said first current carrying electrode of said p-channel transistor being coupled to the I/O site, said second current carrying electrode of said p-channel transistor being coupled to said first supply voltage terminal, said control electrode of said p-channel transistor being coupled to said output of said second multiplexor;

an n-channel transistor having first and second current carrying electrodes and a control electrode, said first current carrying electrode of said n-channel transistor being coupled to the I/O site, said second current carrying electrode of said n-channel transistor being coupled to said second supply voltage terminal, said control electrode of said n-channel transistor being coupled to said output of said first multiplexor;

circuit means being coupled to receive a driving signal, an enable signal and first and second control signals for providing said first and second signals respectively to said first inputs of said first and second multiplexors; and control means for providing a first select signal to said select inputs of said first and second multiplexors, said control means having inputs being responsive to first and second control signals, said control means having first and second outputs respectively coupled to said select inputs of said first and second multiplexors.

7. The circuit according to claim 6 wherein said circuit means includes:

a logic circuit including:
  a first inverter having an input and an output, said input of said first inverter being coupled to receive said enable signal;
  an OR gate having first and second inputs and an output, said first and second inputs of said OR gate being respectively coupled to receive said first and second control signals; and
  a first NOR gate having first and second inputs and an output, said first and second inputs of said first NOR gate being respectively coupled to said outputs of said first inverter and said OR gate; and a tri-state control circuit including:
  a second inverter having an input and an output, said input of said second inverter being coupled to receive said drive signal;
  a third inverter having an input and an output, said input of said third inverter being coupled to said output of said first NOR gate;
  a second NOR gate having first and second inputs and an output, said first and second inputs of said second NOR gate being respectively coupled to said outputs of said second and third inverters, said output of said NOR gate being coupled to said first output of said circuit means; and
  a NAND gate having first and second inputs and an output, said first and second inputs of said NAND gate being respectively coupled to said output of said second inverter and said output of said first NOR gate, said output of said NAND gate being coupled to said second output of said circuit means.

8. The circuit according to claim 6 wherein said control means includes:

a third multiplexor having first and second inputs, a select input and an output, said first input of said third multiplexor being coupled to said second supply voltage terminal, said second input of said third multiplexor being coupled to receive said second control signal, said output of said third multiplexor being coupled to said select input of said second multiplexor;

a fourth multiplexor having first and second inputs, a select input and an output, said first input of said fourth multiplexor being coupled to said second supply voltage terminal, said second input of said fourth multiplexor being coupled to receive said first control signal, said output of said fourth multiplexor being coupled to said select input of said first multiplexor; and gate means for providing a second select signal to said select inputs of said third and fourth multiplexors, said gate means having first and second inputs respectively coupled to receive said first and second control signals, said gate means having an output coupled to said select inputs of said third and fourth multiplexors.

9. A circuit for programming an I/O site of a programmable logic device, comprising:

a first multiplexor having first, second, third and fourth inputs, first and second select inputs, and an output, said third and fourth inputs of said first multiplexor being coupled to receive a signal, said second input of said first multiplexor being coupled to a first supply voltage terminal, said first input of said first multiplexor being coupled to a second supply voltage terminal, said first and second select inputs of said first multiplexor being respectively coupled to receive first and second control signals;

a second multiplexor having first and second inputs, a select input and an output, said first input of said second multiplexor being coupled to said first supply voltage terminal, said second input of said second multiplexor being coupled to receive an enable signal, said select input of said second multiplexor being coupled to receive said first control signal;

a tri-state logic circuit having first and second inputs and first and second outputs, said first and second inputs of said tri-state logic circuit being respectively coupled to said outputs of said first and second multiplexors;

a p-channel transistor having first and second current carrying electrodes and a control electrode, said first current carrying electrode of said p-channel transistor being coupled to the I/O site, said second current carrying electrode of said p-channel transistor being coupled to said first supply voltage terminal, said gate electrode of said p-channel transistor being coupled to said first output of said tri-state logic circuit; and an n-channel transistor having first and second current carrying electrodes and a control electrode, said first current carrying electrode of said n-channel transistor being coupled to the I/O site, said second current carrying electrode of said n-channel transistor being coupled to said second supply voltage terminal, said control electrode of said n-channel transistor being coupled to said second output of said tri-state logic circuit.

10. The circuit according to claim 9 wherein said tri-state logic circuit includes:

a first inverter having an input and an output, said input of said first inverter being coupled to said output of said first multiplexor;

a second inverter having an input and an output, said input of said second inverter being coupled to said output of said second multiplexor;

a NOR gate having first and second inputs and an output, said first and second inputs of said NOR gate being respectively coupled to said outputs of said first and second inverters, said output of said NOR gate being coupled to said control electrode of said p-channel transistor; and a NAND gate having first and second inputs and an output, said first and second inputs of said NAND gate being respectively coupled to said output of said first inverter and said output of said second multiplexor, said output of said NAND gate being coupled to said control electrode of said n-channel transistor.

11. A circuit for programming an I/O site in a programmable logic device, comprising:

first multiplexor means being responsive to first and second select signals for providing either a signal, a first voltage or a second voltage at an output thereof;

second multiplexor means being responsive to said first select signal for alternately providing an another signal or said second voltage at an output thereof;

a tri-state logic circuit (46) having first and second inputs and first and second outputs, said first and second inputs of said tri-state logic circuit being respectively coupled to said outputs of said first and second multiplexor means; and an output transistor circuit being coupled between said first and second voltages and to the I/O site, said output transistor circuit having first and second inputs being respectively coupled to said first and second outputs of said tri-state logic circuit.

12. The circuit according to claim 11 wherein said tri-state logic circuit includes:

a first inverter having an input and an output, said input of said first inverter being coupled to said output of said first multiplexor means;

a second inverter having an input and an output, said input of said second inverter being coupled to said output of said second multiplexor means;

a NOR gate having first and second inputs and an output, said first and second inputs of said NOR gate being respectively coupled to said outputs of said first and second inverters, said output of said NOR gate being coupled to said first input of said output transistor circuit; and a NAND gate having first and second inputs and an output, said first and second inputs of said NAND gate being respectively coupled to said output of said first inverter and said output of said second multiplexor means, said output of said NAND gate being coupled to said second input of said output transistor circuit.

13. The circuit according to claim 11 wherein said output transistor circuit includes:

a p-channel transistor having first and second current carrying electrodes and a control electrode, said first current carrying electrode of said p-channel transistor being coupled to the I/O site, said second current carrying electrode of said p-channel transistor being coupled to receive said second voltage, said control electrode of said p-channel transistor being coupled to said first output of said tri-state logic circuit; and an n-channel transistor having first and second current carrying electrodes and a control electrode, said first current carrying electrode of said n-channel transistor being coupled to the I/O site, said second current carrying electrode of said n-channel transistor being coupled to receive said first voltage, said control electrode of said n-channel transistor being coupled to said second output of said tri-state control circuit.

14. The circuit according to claim 11 further including a pre-driver circuit coupled between said first and second outputs of said tri-state logic circuit and said first and second inputs of said output transistor circuit.

* * * * *